United States Patent
Watanabe

(10) Patent No.: US 7,580,282 B2
(45) Date of Patent: Aug. 25, 2009

(54) FLOATING-GATE NON-VOLATILE MEMORY ARCHITECTURE FOR IMPROVED NEGATIVE BIAS DISTRIBUTION

(75) Inventor: Kazuo Watanabe, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/188,777

(22) Filed: Jul. 26, 2005

(65) Prior Publication Data
US 2006/0023510 A1 Feb. 2, 2006

(30) Foreign Application Priority Data
Jul. 27, 2004 (JP) .............. 2004-218152

(51) Int. Cl.
*G11C 16/14* (2006.01)
(52) U.S. Cl. ................................ 365/185.11
(58) Field of Classification Search ............ 365/185.11, 365/230.06, 185.29, 218
See application file for complete search history.

(56) References Cited

U.S. PATENT DOCUMENTS

| | | | | |
|---|---|---|---|---|
| 5,615,162 A | * | 3/1997 | Houston | ............. 365/226 |
| 5,652,450 A | * | 7/1997 | Hirano | ............. 257/323 |
| 5,774,399 A | * | 6/1998 | Kwon | ............. 365/185.18 |
| 5,963,479 A | * | 10/1999 | Park et al. | ............. 365/185.29 |
| 5,991,517 A | * | 11/1999 | Harari et al. | ............. 714/3 |
| 6,064,623 A | | 5/2000 | Ha | |
| 6,456,530 B1 | * | 9/2002 | Micheloni et al. | ...... 365/185.13 |
| 2003/0218217 A1 | * | 11/2003 | Saito | ............. 257/390 |
| 2005/0254299 A1 | * | 11/2005 | Tanuma et al. | ......... 365/185.11 |

FOREIGN PATENT DOCUMENTS

| | | |
|---|---|---|
| JP | 2001-028197 A | 1/2001 |
| JP | 2001-52495 A | 2/2001 |

* cited by examiner

*Primary Examiner*—J. H. Hur
*Assistant Examiner*—Douglas King
(74) *Attorney, Agent, or Firm*—Sughrue Mion, PLLC

(57) ABSTRACT

A floating-gate non-volatile memory is composed of a plurality of banks, and a negative bias power line providing a negative bias for the plurality of banks. Each of the plurality of banks includes a plurality of sectors arranged in columns, each comprising a plurality of floating-gate memory cells; a plurality of column decoders associated with the columns of the sectors, respectively; and a bank decoder connected to the plurality of column decoders through an in-bank power line. A bank decoder within selected one of the banks provides the negative bias received from the negative bias power line for the in-bank power line. Each of the column decoders is responsive to selection/non-selection of associated one of the columns of the sectors for generating a negative voltage signal from the negative bias received from the in-bank power line, and providing the negative voltage signal for the associated one of the columns of the sectors.

3 Claims, 6 Drawing Sheets

Fig. 4

| | | SELECT SECTOR 111,1 | SELECT SECTOR 112,1 | SELECT SECTOR 111,2 | SELECT SECTOR 112,2 | UNSELECT BANK 1 |
|---|---|---|---|---|---|---|
| CONTROL INPUT | TBANK | High | High | High | High | Low |
| | ER_EN | High | High | High | High | — |
| | X<1> | Low | High | Low | Low | — |
| | X<2> | High | Low | High | Low | — |
| | Y<1> | High | Low | High | Low | — |
| | Y<2> | Low | High | Low | High | — |
| NEGATIVE BIASING BANK DECODER 12 | VNEGB | -10V | -10V | -10V | -10V | 0V |
| NEGATIVE BIASING ROW DECODER 141 | VNEG<1> | -10V | 0V | -10V | 0V | 0V |
| | SY<1> | -10V | VCC | -10V | VCC | VCC |
| NEGATIVE BIASING ROW DECODER 142 | VNEG<2> | 0V | -10V | 0V | -10V | 0V |
| | SY<2> | VCC | -10V | VCC | -10V | VCC |
| NEGATIVE BIASING COLUMN DECODER 131 | Sx1<1> | -10V | -10V | 0V | 0V | VCC |
| | Sx2<1> | 0V | 0V | -10V | -10V | VCC |
| NEGATIVE BIASING COLUMN DECODER 132 | Sx1<2> | VCC | VCC | -10V | -10V | VCC |
| | Sx2<2> | -10V | -10V | 0V | 0V | 0V |

Fig. 5

| | SELECT BANK SELECT SECTOR COLUMN | SELECT BANK UNSELECT SECTOR COLUMN | UNSELECT BANK |
|---|---|---|---|
| $T_{BANK}$ | High | High | Low |
| $ER\_EN$ | High | High | — |
| $X<i>$ | High | Low | — |
| $V_{NEGB}$ | -10V | -10V | 0V |
| $S_A$ | VCC | 0V | 0V |
| $S_B$ | VCC | VCC | 0V |
| $S_C$ | VCC | 0V | VCC |
| $S_{X1}<i>$ | -10V | VCC | VCC |
| $S_{X2}<i>$ | 0V | -10V | 0V |

FLOATING-GATE NON-VOLATILE MEMORY ARCHITECTURE FOR IMPROVED NEGATIVE BIAS DISTRIBUTION

BACKGROUND OF THE INVENTION

1. Field of the Invention

The present invention relates to floating-gate non-volatile memories, especially to techniques for distributing a negative bias to desired sectors within a floating-gate non-volatile memory.

2. Description of the Related Art

As known in the art, conventional floating-gate non-volatile memories, such as flash memories, achieve erasing data within a memory array through applying a negative bias to a control gate. Applying a negative voltage on a control gate removes charges from the control gate, and thereby achieves erasing data of the memory cell.

In a typical floating-gate non-volatile memory, erasing data of the memory array is achieved on a sector to sector basis; a floating-gate non-volatile memory is typically designed to achieve data access to individual sectors, separately. When a certain sector is selected as a target of erase operation, a negative bias is applied to the selected sector. The row decoder within the selected sector provides the associated control gates with the negative bias to thereby erase data stored in all the memory cells within the selected sector.

Flash memories are desirably designed so that individual sectors are allowed to operate in different operation modes. For example, a certain sector is operated in the programming mode while another sector is operated in the erase mode. Such flash memory operation desirably improves operation flexibility.

Operating individual sectors in different operation modes requires selectively providing a negative bias for sectors performing the erase operation. Japanese Open Laid Patent Application No. 2001-28197 discloses a flash memory architecture which selects sectors arranged in rows and columns by row and column decoders, and provides a desired bias for selected sectors.

One issue of the floating-gate non-volatile memory designed to selectively provide a negative bias for desired sectors is that the size of the circuitry used for selecting sectors, such as row and column decoders, is undesirably large. The increase in the size of the select circuitry undesirably enlarges the chip size of the floating-gate non-volatile memory.

Therefore, there is a need for providing floating-gate memory architecture designed to provide a negative bias for desired sectors with reduced size.

SUMMARY OF THE INVENTION

In an aspect of the present invention, a floating-gate non-volatile memory is composed of a plurality of banks, and a negative bias power line providing a negative bias for the plurality of banks. Each of the plurality of banks includes a plurality of sectors arranged in columns, each comprising a plurality of floating-gate memory cells; a plurality of column decoders associated with the columns of the sectors, respectively; and a bank decoder connected to the plurality of column decoders through an in-bank power line. A bank decoder within selected one of the banks provides the negative bias received from the negative bias power line for the in-bank power line. Each of the column decoders is responsive to selection/non-selection of associated one of the columns of the sectors for generating a negative voltage signal from the negative bias received from the in-bank power line, and providing the negative voltage signal for the associated one of the columns of the sectors.

The floating-gate non-volatile memory thus constructed provides hierarchical architecture for selective biasing with a negative voltage, and thereby improves circuit design simplicity. This effectively reduces the chip size of the floating-gate non-volatile memory.

BRIEF DESCRIPTION OF THE DRAWINGS

The above and other advantages and features of the present invention will be more apparent from the following description taken in conjunction with the accompanied drawings, in which:

FIG. 4 is a truth table illustrating an exemplary operation of the circuits integrated within the floating-gate non-volatile memory;

FIG. 5 is a truth table illustrating an exemplary operation of the negative biasing column decoder.

DESCRIPTION OF THE PREFERRED EMBODIMENTS

Figure 1:
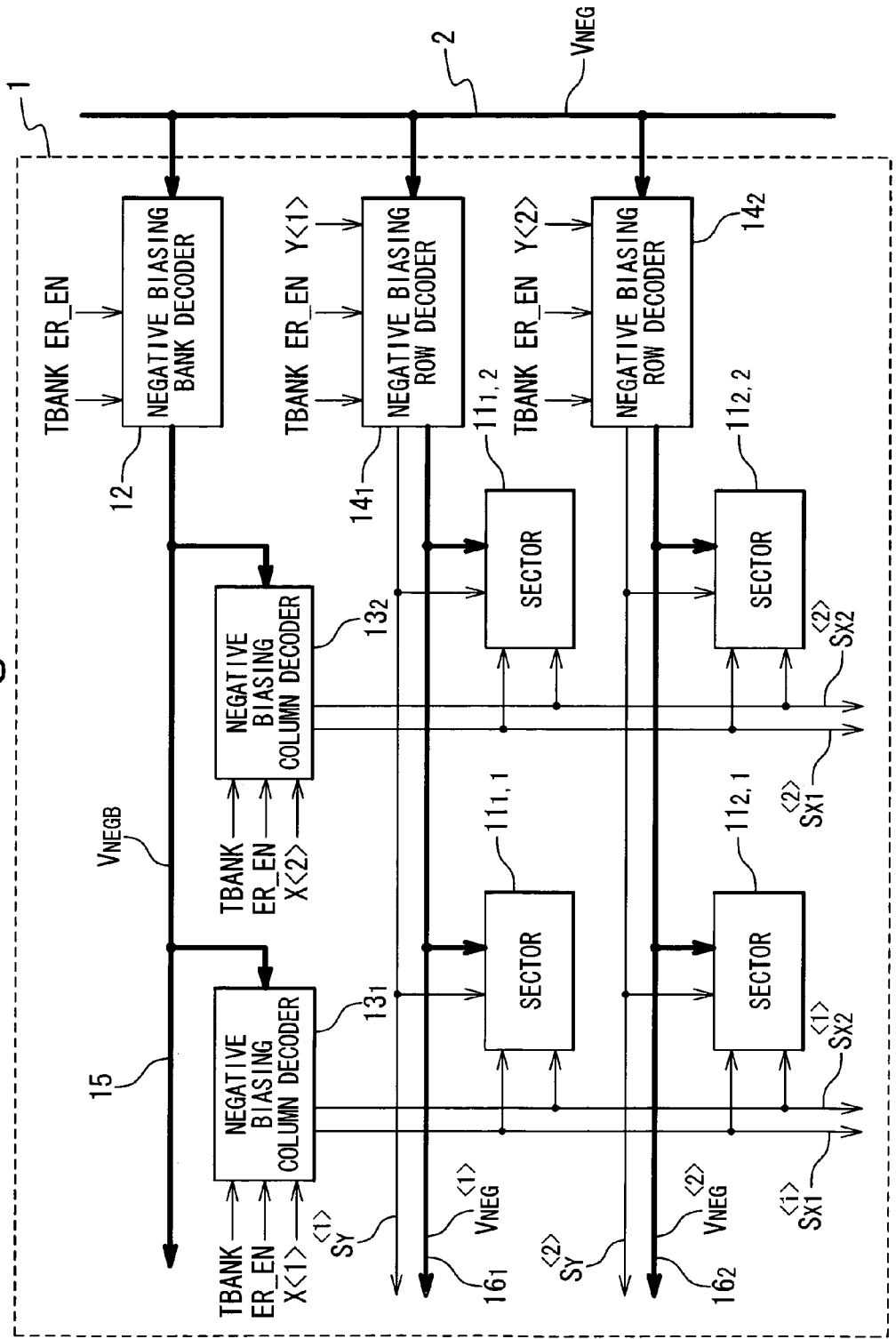
FIG. 1 is a block diagram illustrating an exemplary structure of a floating-gate non-volatile memory in one embodiment of the present invention.

The invention will be now described herein with reference to illustrative embodiments. Those skilled in the art would recognize that many alternative embodiments can be accomplished using the teachings of the present invention and that the invention is not limited to the embodiments illustrated for explanatory purposed.

(Memory Structure)

In one embodiment of the present invention, a floating-gate non-volatile memory is composed of a plurality of banks 1 (one shown) connected to a negative bias power line 2. The negative bias power line 2 is used for distributing a negative bias. In this embodiment, the voltage level $V_{NEG}$ of the negative bias power line 2 is $-10$ V.

Each bank 1 is composed of sectors 11 arranged in rows and columns. Each sector 11 incorporates floating-gate memory cells arranged in rows and columns. Erase operation of the floating-gate memory cells are achieved on a sector to sector basis. If necessary, the sectors 11 may be identified by a pair of subscripts, one being associated with rows of sectors 11, and another being associated with columns. A sector $11_{i,j}$ designates a sector positioned in the i-th row and the j-th column.

In order to selectively provide desired sectors with the negative bias of the voltage level $V_{NEG}$ ($=-10$V), each bank 1 includes a negative biasing bank decoder 12, a set of negative biasing column decoders 13, and a set of negative biasing row decoders 14. The negative bank decoder 12 has a power input connected to the negative bias power line 2, and an output connected to the in-bank power line 15. The negative biasing column decoders 13 each have a power input connected to the in-bank power line 15. The negative biasing row decoders 14 each have a power input directly connected to the negative bias power line 2, and an output connected to an in-bank power line 16 associated therewith. The negative biasing column decoders 13 are associated with the columns of the sectors 11, respectively, and the negative biasing row decoders 14 are associated with the rows of the sectors 11, respectively.

If necessary, the negative biasing column decoders 13, the negative biasing row decoders 14, and the in-bank power lines 16 may be individually identified by subscripts. The negative biasing column decoder $13_i$ designates the negative biasing column decoder 13 associated with the sectors 11 in the i-th column. Correspondingly, the negative biasing column decoder $14_j$ designates the negative biasing row decoder 14 associated with the sectors 11 in the j-th row. Finally, the in-bank power line $16_j$ designates the n-bank power line 16 associated with the sectors 11 in the j-th row.

The negative biasing bank decoder 12 is responsive to a bank select signal TBANK, and an erase enable signal ER_EN to provide the in-bank power line 15 with the negative bias $V_{NEG}$ received from the negative bias power line 2. The bank select signal TBANK is activated when the associated bank 1 is selected, and the erase enable signal ER_EN is activated when erase operation is performed for the associated bank 1. In this embodiment, the bank select signal TBANK, and the erase enable signal ER_EN are both high-active; activation of the bank select signal TBANK, and the erase enable signal ER_EN is achieved through pulling up these signals to the "High" level. Those skilled in the art would appreciate that the bank select signal TBANK, and the erase enable signal ER_EN may be low-actively.

In response to a certain bank 1 being selected to be the target of the erase operation through activating both of the associated bank select signal TBANK and the erase enable signal ER_EN, the negative biasing bank decoder 12 electrically connects the in-bank power line 15 with the negative bias power line 2 to thereby provide the negative bias of the voltage level $V_{NEG}$ for the in-bank power line 15. The voltage level on the in-bank power line 15 is referred to as the voltage $V_{NEGB}$, hereinafter. When at least one of the bank select signal TBANK and the erase enable signal ER_EN is deactivated, the negative biasing bank decoder 12 pulls down the in-bank power line 15 to 0 V.

The negative biasing column decoders $13_i$ is responsive to a sector column select signal X<i> for developing a pair of control signals $S_{X1}^{<i>}$, and $S_{X2}^{<i>}$. The sector column select signal X<i> is activated when the i-th column of the sectors 11 is selected. In this embodiment, the sector column select signal X<i> is high-active. The voltage level of the control signal $S_{X1}^{<i>}$ is switched between the negative bias $V_{NEG}$ and a power supply level $V_{CC}$, while the voltage level of the control signal $S_{X1}^{<i>}$ is switched between 0 V and the negative voltage level $V_{NEG}$. The negative bias provided from the in-bank power line 15 is used to pull down the control signals $S_{X1}^{<i>}$ and $S_{X2}^{<i>}$. The negative biasing column decoder $13_i$ is also responsive to the aforementioned bank select signal TBANK and the erase enable signal ER_EN. The detailed structure and operation of the negative biasing column decoder $13_i$ will be described later.

The negative biasing row decoder $14_j$ operates in response to a sector row select signal Y<j>, being also responsive to the bank select signal TBANK and the erase enable signal ER_EN. The sector row select signal Y<j> is activated when the j-th row of the sectors 11 is selected.

Specifically, the negative biasing row decoder $14_j$ is responsive to the bank select signal TBANK, the erase enable signal ER_EN, and the row select signal Y<j> for providing the in-bank power line $16_j$ with the negative bias of the negative voltage level $V_{NEG}$ received from the negative power line 2. In response to the selection of the j-th row of the sectors 11 through activating the bank select signal TBANK, the erase enable signal ER_EN, and the row select signal Y<j>, the negative biasing row decoder $14_j$ pulls down the in-bank power line $16_j$ to the negative voltage level $V_{NEG}$ by connecting the in-bank power line $16_j$ with the negative bias power line 2. When at least one of the bank select signal TBANK, the erase enable signal ER_EN, and the row select signal Y<j> is not activated, the negative biasing row decoder $14_j$ sets the in-bank power line $16_j$ to 0 V. The voltage level of the in-bank power line $16_j$ is referred to as the voltage $V_{NEG}^{<j>}$, hereinafter.

Additionally, the negative biasing row decoder $14_j$ is designed to develop a control signal $S_Y^{<j>}$ used for controlling the sectors 11 in the j-th row, in response to the bank select signal TBANK, the erase enable signal ER_EN, and the row select signal Y<j>. The voltage level of the control signal $S_Y^{<j>}$ is switched between the negative voltage level $V_{NEG}$ and the power supply level $V_{CC}$. The negative bias received from the negative bias power line 2 is used for pulling down the control signal $S_Y^{<j>}$ to the negative voltage level $V_{NEG}$.

(Sector Structure)

Figure 2:
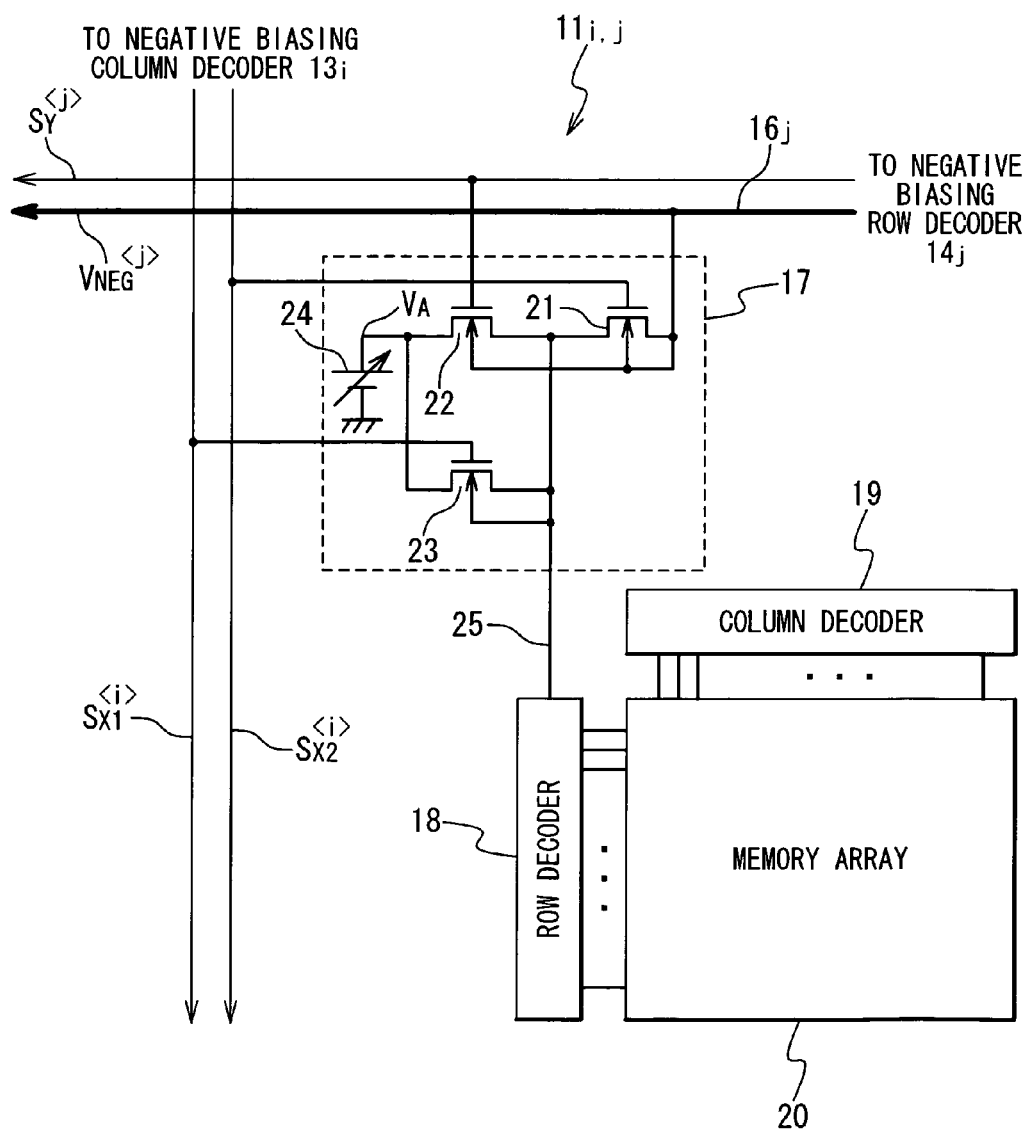
FIG. 2 is a circuit diagram of a sector integrated within the floating-gate non-volatile memory.

Referring to FIG. 2, the sector $11_{i,j}$ is designed to provide the negative bias received from the in-bank power line $16_j$ for the associated floating-gate memory cells integrated therein, when being selected as the target of the erase operation. The sector $11_{i,j}$ is responsive to the control signals $S_{X1}^{<i>}$, $S_{X2}^{<i>}$ received from the negative biasing column decoder $13_i$, and the control signal $S_Y^{<j>}$ received from the negative biasing row decoder $14_j$ for providing the negative bias of the negative voltage $V_{NEG}$ for the circuitry within the sector $11_{i,j}$.

Specifically, the sector $11_{i,j}$ is composed of a negative bias switch 17, a row decoder 18, a column decoder 19, and a memory array 20 in which the floating-gate memory cells are arranged in rows and columns. The negative bias switch 17 is responsive to the control signals $S_{X1}^{<i>}$, $S_{X2}^{<i>}$, and $S_Y^{<j>}$ for providing the row decoder 18 with the negative bias of the voltage level $V_{NEG}$ received from the in-bank power line $16_j$ through a negative bias feed line 25. The row decoder 18 selects rows of the floating-gate memory cells within the memory array 20, while the column decoder 19 selects columns of the floating-gate memory cells. During erase operation, the row decoder 18 provides the control gates of the floating-gate memory cells with the negative bias to erase data stored in the floating-gate memory cells.

The negative bias switch 17 is composed of NMOS transistors 21, 22, and 23. The NMOS transistors 21 and 22 are connected in series between the in-bank power line $16_j$ and a power supply 24 developing a voltage of $V_A$ which is slightly higher than 0 V. The NMOS transistor 21 has a source connected to the in-bank power line 16*j*, and a drain connected to the negative bias feed line 25. The NMOS transistor 22 has a source connected to the negative bias feed line 25, and a drain connected to the power supply 24. The gate of the NMOS transistor 21 receives the control signal $S_{X2}^{<i>}$ from the negative biasing column decoder $13_i$, while the gate of the NMOS transistor 22 receives the control signal $S_Y^{<j>}$ from the negative row decoder $14_j$. The substrate terminals of the NMOS transistors 21 and 22 are connected to the in-bank power line $16_j$. The NMOS transistor 23 is connected between the power supply 24 and the negative bias feed line 25. In detail, the source of the NMOS transistor 23 is connected to the negative bias feed line 25, and the drain is connected to the power supply 24. The gate of the NMOS transistor 23 receives the control signal $S_{X1}^{<i>}$ from the negative biasing column decoder $13_i$.

When the sector $11_{i,j}$ is selected as the target of the erase operation, the control signals $S_{X1}^{<i>}$, $S_{X2}^{<i>}$ from the negative biasing column decoder $13_i$ are set to the voltage level $V_{NEG}$ (=−10 V), and 0 V, respectively, and the control signal $S_Y^{<j>}$ received from the negative biasing row decoder $14_j$ and the voltage level $V_{NEG}^{<j>}$ of the in-bank power line $16_j$ are both pulled down to the negative voltage level $V_{NEG}$ (=−10 V). This results in that the negative bias feed line 25 is provided with the negative bias of the voltage level $V_{NEG}$, the NMOS transistor 21 being turned on, and the NMOS transistors 22 and 23 being turned off. The row decoder 18 achieves erasing data stored in the memory array 20, using the negative bias provided therefor.

When the sector $11_{i,j}$ is not selected, at least one of the NMOS transistors 22 and 23 is turned off, and thereby the negative bias feed line 25 is provided with the voltage $V_A$, which is a positive voltage close to 0 V. This allows the sector $11_{i,j}$ to perform other operations, such as program operation and verify operation.

(Structure and Function of Negative Column Decoder)

An important feature of the non-volatile memory architecture shown in FIG. 1 is that the circuitry developing the control signals $S_{X1}^{<i>}$ which are allowed to be pulled down to the negative voltage level $V_{NEG}$, are hierarchically designed, including the negative biasing bank decoder 12 and the negative biasing column decoders 13. Such hierarchical architecture is effective for reducing the circuit size of each negative biasing column decoder $13_i$. The reason is that each negative biasing column decoder $13_i$ is provided with the negative bias of the voltage level $V_{NEG}$, only when the associated bank 1 is selected. This allows developing the control signal $S_{X1}^{<i>}$ in response to only the sector column select signal X<i>, independently of selection/non-selection of the associated bank 1, and thereby simplifies the circuit logic of each negative biasing column decoder $13_i$. The simplification of the circuit logic effectively reduces the circuit size of the each negative biasing column decoder $13_i$, and the resultant chip size of the non-volatile memory.

Figure 3:
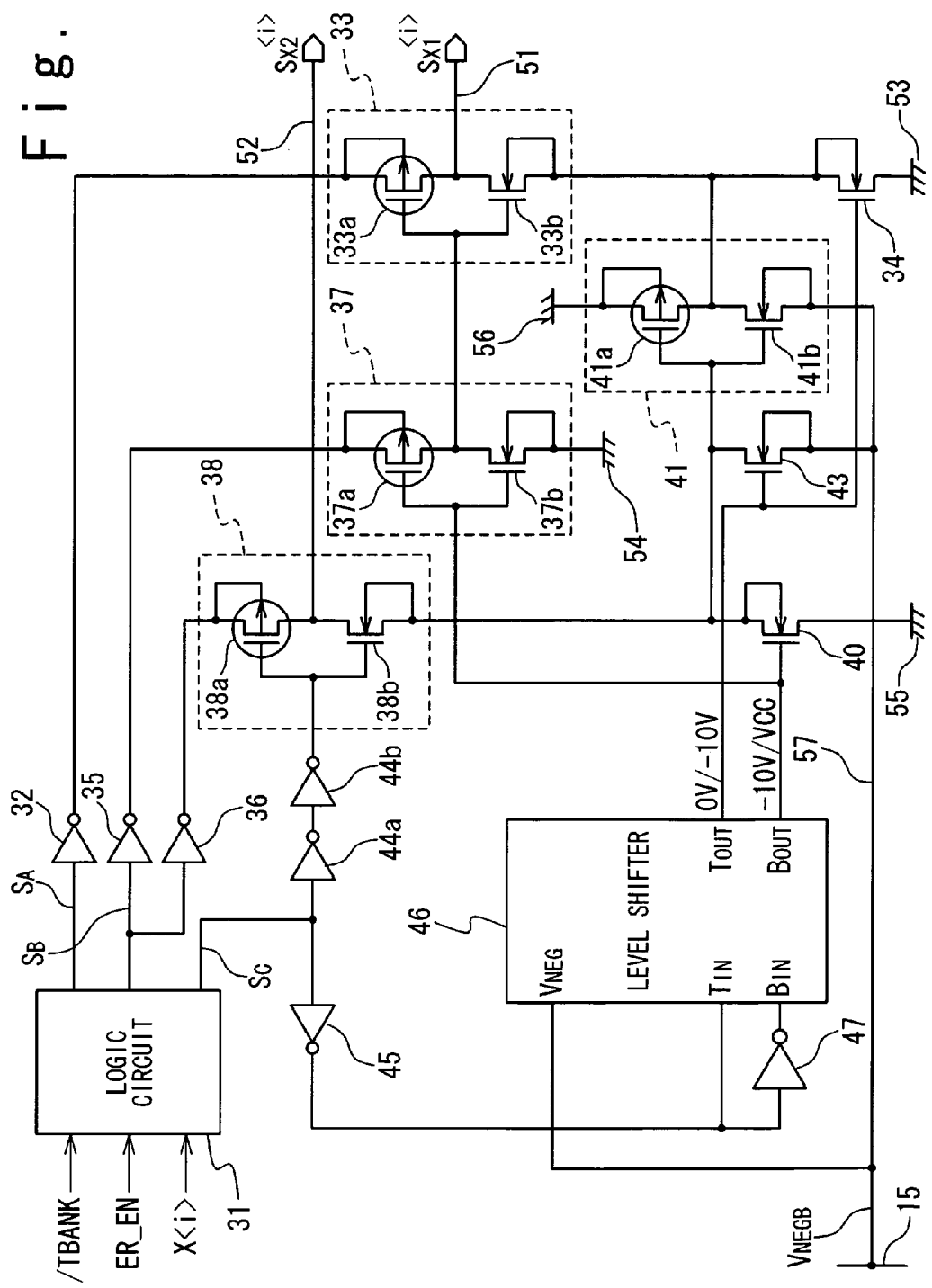
FIG. 3 is a circuit diagram illustrating an exemplary structure of a negative biasing column decoder integrated within the floating-gate non-volatile memory.

FIG. 3 is a circuit diagram illustrating a preferable structure of the negative biasing column decoder $13_i$ adapted to the aforementioned hierarchical architecture.

In one embodiment, the negative biasing column decoder $13_i$ is composed of a logic circuit 31 developing a set of control signals $S_A$, $S_B$, and $S_C$ in response to the bank select signal TBANK, the erase enable signal ER_EN, and the sector column select signal X<i>. As shown in FIG. 5, the logic circuit 31 within the negative biasing column decoder $13_i$ pulls up all of the control signals $S_A$, $S_B$ and $S_C$ to the power supply level $V_{CC}$ when the i-th column of the sectors is selected, that is, when the bank select signal TBANK, the erase enable signal ER_EN, and the sector column select signal X<i> are all activated. When the i-th column of the sectors is unselected with the associated bank 1 selected, (that is, when the bank select signal TBANK and the erase enable signal ER_EN are activated with the sector column select signal X<i> deactivated), the logic circuit 31 pulls up only the control signal $S_B$ to the power supply level $V_{CC}$, pulling down the control signals $S_A$ and $S_C$ to 0V. When the associated bank 1 is not selected, the logic circuit 31 pulls down the control signals $S_A$ and $S_B$ to 0 V, pulling up the control signal $S_C$ to the power supply level $V_{CC}$.

The control signal $S_A$, developed by the logic circuit 31, is provided for the power input of an inverter 33 through an inverter 32. The inverter 33 is used as an output stage for outputting the control signal $S_{X1}^{<i>}$ from the negative biasing column decoder $13_i$. The inverter 33 is composed of a PMOS transistor 33a and an NMOS transistor 33b. The drains of the PMOS and NMOS transistors 33a and 33b are commonly connected to an output terminal 51 on which the control signal $S_{X1}^{<i>}$ is developed. The gates of the PMOS and NMOS transistors 33a and 33b are commonly connected, and used as the input terminal of the inverter 33. The source of the PMOS transistor 33a is connected to the output of the inverter 32 and the source of the NMOS transistor 33b is connected to an earth terminal 53 through an NMOS transistor 34.

The control signal $S_B$ is provided for the power input of an inverter 37 through an inverter 35. The inverter 37 is composed of a PMOS transistor 37a, and an NMOS transistor 37b. The drains of the PMOS and NMOS transistors 37a and 37b are commonly connected, and used as the output terminal of the inverter 37. The output of the inverter 37 (that is, the commonly connected drains of the PMOS and NMOS transistors 37a and 37b) is connected to the input of the inverter 33. The gates of the PMOS and NMOS transistors 37a and 37b are commonly connected, and used as the input terminal of the inverter 37. The source of the PMOS transistor 37a is connected to the output of the inverter 35, and the source of the NMOS transistor 37b is connected to an earth terminal 54.

The control signal $S_B$ is also provided for the power input of an inverter 38 through an inverter 36. The inverter 38 is used as an output stage outputting the control signal $S_{X2}^{<i>}$ from the negative biasing column decoder $13_i$. The inverter 38 is composed of a PMOS transistor 38a, and an NMOS transistor 38b. The drains of the PMOS and NMOS transistors 38a and 38b are commonly connected to an output terminal 52 on which the control signal $S_{X2}^{<i>}$ is developed. The gates of the PMOS and NMOS transistors 38a and 38b are commonly connected, and used as the input terminal of the inverter 38. The source of the PMOS transistor 38a is connected to the output of the inverter 32, and the source of the NMOS transistor 38b is connected to an earth terminal 55 through an NMOS transistor 40. The source of the NMOS transistor 38b is also connected to a power line 57 through an NMOS transistor 43. The power line 57 is connected to the in-bank power line 15, having a voltage level $V_{NEGB}$.

The control signal $S_C$ is used for controlling the inverters 33 and 38, which are used to interface the control signals $S_{X1}^{<i>}$ and $S_{X2}^{<i>}$, respectively. Specifically, the control signal $S_C$ is provided with the input terminal of the inverter 38 through a pair of inverters 44a and 44b, achieving control of the output of the control signal $S_{X2}^{<i>}$.

Additionally, the control signal $S_C$ is provided for a non-inverting input $T_{IN}$ of a level shifter 46 through an inverter 45, and for an inverting input $B_{IN}$ of the level shifter 46 through the inverter 45 and an inverter 47. The level shifter 46 develops a pair of voltages on the non-inverting output $T_{OUT}$ and the inverting output $B_{OUT}$, so that the developed voltages are responsive to the input voltages on the non-inverting input $T_{IN}$ and the inverting input $B_{IN}$. The level shifter 46 is adapted to develop negative voltages on the non-inverting output $T_{OUT}$ and the inverting output $B_{OUT}$, the power input thereof being connected to the in-bank power line 15. Specifically, the level shifter 46 sets the non-inverting output $T_{OUT}$ and the inverting output $B_{OUT}$ to 0 V and the negative voltage level $V_{NEG}$ (=−10 V), respectively, when the non-inverting input $T_{IN}$ and the inverting input $B_{IN}$ are set to the power supply level $V_{CC}$ and 0 V, respectively. In reverse, the level shifter 46 sets the non-inverting output $T_{OUT}$ and the inverting output $B_{OUT}$ to the negative voltage level $V_{NEG}$ and 0 V, respectively, when the non-inverting input $T_{IN}$ and the inverting input $B_{IN}$ are set to 0 V and the power supply level $V_{CC}$, respectively.

The non-inverting output $T_{OUT}$ of the level shifter 46 is connected to the gates of the NMOS transistors 43 and 34, and the inverting output $B_{OUT}$ is connected to the gate of the NMOS transistor 40. The source of the NMOS transistor 40 and the drain of the NMOS transistor 43 are connected to the input of the inverter 41. The inverter 41 functions as a circuit providing selected one of 0 V and the voltage level $V_{NEGB}$ Of the in-bank power line 15 for the source of the NMOS transistor 33b within the inverter 33. The inverter 41 is composed of the PMOS transistor 41a and the NMOS transistor 41b. The drains of the PMOS and NMOS transistors 41a and 41b are commonly connected, and used as the output terminal of the inverter 41. The gates of the PMOS and NMOS transistors 41a and 41b are commonly connected, and used as the input terminal of the inverter 41. The source of the PMOS transistor 41a is connected to an earth terminal 56, and the source of the NMOS transistor 41b is connected to the power line 57, having the voltage level $V_{NEGB}$. The inverter 41 is allowed to provide the negative bias of the voltage level $V_{NEG}$ for the source of the NMOS transistor 33b within the inverter 33, when the voltage level $V_{NEGB}$ of the in-bank power line 15 is set to the voltage level $V_{NEG}$ (=−10 V).

A significant feature of the negative biasing column decoder $13_i$ shown in FIG. 3 is that the negative biasing column decoder $13_i$ is designed to provide connections between the in-bank power line 15 and the output terminals 51 and 52, used for outputting the control signals $S_{X1}^{<i>}$ and $S_{X2}^{<i>}$ in response to the sector column select signal X<i>.

As is understood from the truth table shown in FIG. 5, the logic circuit 31 within the negative biasing column decoder $13_i$ pulls up the control signal $S_C$ to the power supply level $V_{CC}$ in response to the activation of the sector column select signal X<i>. The pull-up of the control signal $S_C$ allows the level shifter 46, which is provided with the negative bias of the voltage level $V_{NEG}$, to set the non-inverting output $T_{OUT}$ to 0 V and to set the inverting output $B_{OUT}$ to the voltage level $V_{NEG}$ (=−10V). In response to the switching of the level of the non-inverting output $T_{OUT}$ and inverting output $B_{OUT}$, the NMOS transistor 40 is turned off, while the NMOS transistor 43, the NMOS transistor 41b within the inverter 41, and the NMOS transistor 33b within the inverter 33 are turned on. This results in that the output terminal 51 is electrically connected to the in-bank power line 15 through the NMOS transistors 33b, 41b, and the power line 57, and thereby the control signal $S_{X1}^{<i>}$ is pulled down to the negative voltage level $V_{NEG}$ (=−10 V).

When the control signal $S_C$ is pulled down to 0 V, on the other hand, the NMOS transistor 43 and the NMOS transistor 38b within the inverter 38 are turned on. This results in that the output terminal 52 is electrically connected to the in-bank power line 15 through the NMOS transistors 43 and 38b, and thereby the control signal $S_{X2}^{<i>}$ is pulled down to the negative voltage level $V_{NEG}$ (=−10 V).

Such architecture effectively simplifies the circuit logic of the negative biasing column decoder $13_i$ and thereby reduces the circuit size of the negative biasing column decoder $13_i$.

(Operation of the Floating-Gate Non-Volatile Memory)

FIG. 4 is a truth table illustrating an exemplary operation of the floating-gate non-volatile memory in this embodiment.

When a certain bank 1 is not selected, the negative biasing bank decoder 12 and the negative biasing row decoders 14 within the certain bank 1 do not interface the negative bias received from the negative bias power line 2; the in-bank power lines 15 and 16 are all set to 0 V, and no sector 11 is provided with the negative bias. Additionally, with respect to all of the columns of the sectors 11, the controls signals $S_{X1}^{<i>}$ are pulled up to the power supply level $V_{CC}$ with the NMOS transistors 23 turned on. This results in that the negative bias feed line 25 is set to the positive voltage level $V_A$.

When a certain bank 1 is selected as the target of the erase operation, and a certain sector 11 within the selected bank 1 is selected, the negative biasing bank decoder 12, the negative biasing columns decoders 13, and the negative biasing row decoders 14 within the selected bank 1 are operated to selectively provide the circuitry within the selected sector 11 with the negative bias of the voltage level $V_{NEG}$. In the following, it is assumed that the sector $11_{1,1}$ positioned in the first column and the first row is selected through activating the bank select signal TBANK, the erase enable signal ER_EN, the sector column select signal X<1>, and the sector row select signal Y<1>.

The decoders within the selected bank 1 operate as follows: As shown in FIG. 4, the negative biasing bank decoder 12 provides the in-bank power line 15 with the negative bias of the voltage level $V_{NEG}$ (=−10 V). The negative biasing column decoder $13_1$, associated with the selected column of the sectors 11, sets the control signals $S_{X1}^{<1>}$ and $S_{X2}^{<1>}$ to −10 V and 0 V, respectively. The negative biasing row decoder $14_1$, associated with the selected row of the sectors 11, pulls down the voltage level $V_{NEG}^{<1>}$ of the in-bank power line 16, to −10 V and also pulls down the control signal $S_Y^{<1>}$ to −10 V. In response to the control signals $S_{X1}^{<1>}$ $S_{X2}^{<1>}$, and $S_Y^{<1>}$, the negative bias switch 17 within the sector $11_{1,1}$ provides the associated row decoder 18 with the negative bias of −10 V (that is, the voltage level $V_{NEG}^{<1>}$) received from the in-bank power line $16_1$ through the negative bias feed line 25 (see FIG. 2). The row decoder 18 erases data stored in the floating-gate memory cells within the associated memory array 20 using the provided negative bias.

On the other hand, the negative biasing column decoder 132, associated with a non-selected column of the sectors 11, sets the control signals $S_{X1}^{<2>}$ and $S_{X2}^{<2>}$ to the power supply level $V_{CC}$ and −10 V, respectively. In response to the control signals $S_{X1}^{<2>}$ and $S_{X2}^{<2>}$, the negative bias switches 17 within the unselected sectors 11 each provide an electrical connection between the associated negative bias feed line 25 and the power supply 24; the negative bias feed line 25 is disconnected from the in-bank power line $16_1$. This results in that the negative bias feed line 25 is set to the positive voltage level $V_A$, and the row decoders 18 within the non-selected sectors 11 are not provided with the negative bias.

The negative biasing row decoder $14_2$, associated with an unselected row of the sectors 11, sets the voltage level $V_{NEG}^{<2>}$ of the in-bank power line to 0 V, while pulling up the control signal $S_Y^{<2>}$ to the power supply level $V_{CC}$. This results in that the negative bias feed lines 25 are set to the positive voltage level $V_A$ within the non-selected sectors 11; the row decoders 18 within the non-selected sectors 11 do not receive the negative bias.

The operation thus described allows selectively providing the negative bias of −10 V for the circuitry within the selected sector $11_{1,1}$, and performing erase operation within the sector $11_{1,1}$; erase operation is not performed within unselected sectors. The operation for the case that other sectors are selected would be apparent to those skilled in the art from the above-presented description.

CONCLUSION

In summary, the floating-gate non-volatile memory in this embodiment adopts hierarchical architecture for selectively providing a negative bias for the selected sector, including the negative biasing bank decoder 12 and the negative biasing row decoders 13. This effectively achieves circuit simplification of the negative biasing row decoders 13, and thereby reduces the circuit size of the negative biasing row decoders 13. Although requiring an additional bank decoder, such architecture effectively reduces the total chip size of the floating-gate non-volatile memory.

Figure 6:
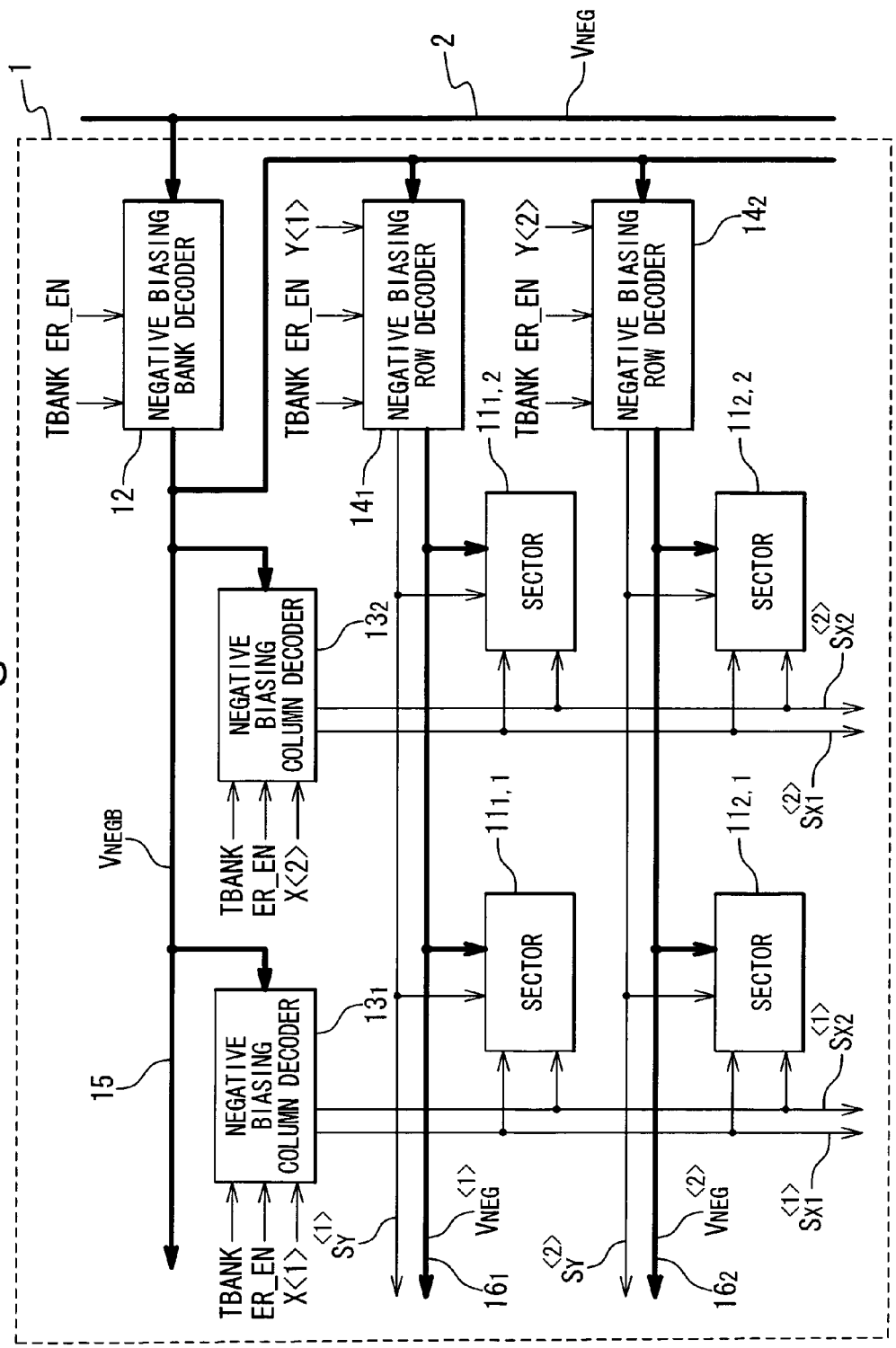
FIG. 6 is a block diagram illustrating a modification of the floating-gate non-volatile memory in accordance with the present invention.

In an alternative embodiment, hierarchical architecture may be applied to the negative biasing row decoders 14 as shown in FIG. 6. In this embodiment, the negative biasing row decoders 14 are connected to the in-bank power line 15 in place of the negative bias power line 2 to receive the negative bias through the in-bank power line 15. The architecture shown in FIG. 6 effectively simplifies the circuit structure of the negative biasing row decoder 14, and thereby further reduces the chip size of the non-volatile memory.

It is apparent that the present invention is not limited to the above-described embodiments, which may be modified and changed without departing from the scope of the invention.

Especially, it would be apparent to those skilled in the art that the numbers of the rows and columns of the sectors 11 may be changed. In the case that the numbers of the rows and/or columns of the sectors 11 are changed, the numbers of the negative biasing column decoders 13 and the negative biasing row decoders 14 are accordingly changed.

What is claimed is:

1. A floating-gate non-volatile memory, comprising:
a plurality of banks; and
a negative bias power line providing a negative bias voltage for said plurality of banks,
wherein each of said plurality of banks comprises:
a plurality of columns each connected to a plurality of sectors, wherein each sector comprises a plurality of floating-gate memory cells,
a plurality of negative biasing column decoders each associated with one column of said plurality of columns, and
a bank decoder connected to said plurality of column decoders through an in-bank power line,
wherein the bank decoder within a selected one of said banks provides said negative bias voltage received from said negative bias power line for said in-bank power line, and
wherein each of said column decoders is responsive to selection of an associated one of said columns for generating a negative voltage signal from said negative bias voltage received from said in-bank power line, and providing said negative voltage signal for said associated one of said columns,
wherein said sectors are arranged in a plurality of rows,
wherein said each of said plurality of banks further includes a plurality of row decoders associated with said rows of said sectors,
wherein one of said row decoders associated with a selected one of said rows of said sectors provides said negative bias voltage received from said negative bias power line for said selected one of said rows of said sectors, and
wherein each of said plurality of banks further comprises a plurality of row direction in-bank power lines associated with said rows of said sectors, said plurality of row direction in-bank power lines providing said negative bias voltage received from said row decoders for said associated rows of said sectors,
wherein each of said sectors comprises:
a decoder which selects said floating gate memory cells,
a negative bias feed line connected to said decoder, and
a negative bias switch connected between said row direction in-bank power line and said negative bias feed line,
wherein said negative bias switch includes:
a first N-channel MISFET comprising a gate which receives said negative voltage signal from an associated one of said column decoders, a source connected to an associated one of said row direction in-bank power lines, and a drain connected to said negative bias feed line,
a second MISFET comprising a gate which receives a control signal from an associated one of said row decoders, a source connected to said negative bias feed line, and a drain connected to a power supply,
a third MISFET comprising a gate which receives a control signal from an associated one of said column decoders, a source connected to said negative bias feed line, and a drain connected to said power supply.

2. A method of operating a floating-gate non-volatile memory, comprising:
selecting a bank out of a plurality of banks, wherein each bank comprises a plurality of columns each connected to a plurality of sectors and a plurality of rows each connected to a plurality of sectors, wherein each column is associated with one of a plurality of negative biasing column decoders and each row is associated with one of a plurality of negative biasing row decoders;
providing a negative bias voltage for a negative bias power line;
providing said negative bias voltage received from said negative bias power line to an in-bank power line through a bank decoder within said selected bank;
selecting one column of said plurality of columns using said associated column decoder;
generating a negative voltage signal from said negative bias voltage received by said associated column decoder from said in-bank power line in response to said selection of said column;
providing said negative voltage signal for said selected column with said associated column decoder,
wherein a first N-channel MISFET comprising a source connected to an in-bank power line, and a drain connected to a negative bias feed line connected to a decoder which selects floating-gate memory cells within a memory array,
a second N-channel MISFET comprising a source connected to said negative bias feed line, and a drain connected to a power supply, and
a third N-channel MISFET comprising a source connected to said negative bias feed line, and a drain connected to said power supply, said method comprising:
(A) providing a negative bias voltage for said in-bank power line, and turning on said first N-channel MISFET with said second and third N-channel MISFETs turned off, when a target sector and a target bank are both selected, said negative bias switch circuit being integrated within said target sector, and said target sector being incorporated into said target bank;
(B) providing a ground level voltage potential for said in-bank power line, and turning on said second N-channel MISFET, when said target bank and a target row of sectors where said target sector is positioned are both selected with a target column of sectors where said target sector is positioned unselected;
(C) providing a negative bias voltage for said in-bank power line, and turning on said third N-channel MISFET with said first and second N-channel MISFETs turned off, when said target bank and said target column are both selected with said target row unselected; and (D) providing a ground level voltage potential for said in-bank power line, and turning on said third N-channel MISFET, when said bank is unselected.

3. The method according to claim 2, wherein (A) further comprises:
   providing a ground level voltage potential for a gate of said first N-channel MISFET; and
   providing a negative bias voltage for gates of said second and third N-channel MISFETS;
   wherein (B) further comprises providing a power supply voltage level for a gate of said second N-channel MISFET,
   wherein (C) further comprises:
   providing a negative bias voltage for said gate of said first N-channel MISFET, and
   providing a power supply voltage level for said gate of said third N-channel MISFET, and
   wherein (D) further comprises providing a power supply voltage level for said gate of said third N-channel MISFET.

* * * * *

UNITED STATES PATENT AND TRADEMARK OFFICE
CERTIFICATE OF CORRECTION

PATENT NO. : 7,580,282 B2 Page 1 of 1
APPLICATION NO. : 11/188777
DATED : August 25, 2009
INVENTOR(S) : Kazuo Watanabe It is certified that error appears in the above-identified patent and that said Letters Patent is hereby corrected as shown below:

Col. 3, line 52: delete "$S_{x1}^{<1>}$", insert --$S_{x2}^{<1>}$--

Col. 5, line 18: delete "off", insert --on--

Signed and Sealed this

Sixteenth Day of February, 2010

David J. Kappos
*Director of the United States Patent and Trademark Office*